US010027000B2

(12) United States Patent
Palmieri et al.

(10) Patent No.: US 10,027,000 B2
(45) Date of Patent: Jul. 17, 2018

(54) SYSTEM OF ACCUMULATOR BATTERIES WITH MORE RELIABLE VOLTAGE MEASUREMENT

(71) Applicant: RENAULT S.A.S., Boulogne-billancourt (FR)

(72) Inventors: Michaël Palmieri, Gieres (FR); Marc Beranger, Biviers (FR); Sébastien Carcouet, Vif (FR); Lionel Cordesses, Montigny le Bretonneux (FR); Alexis Derbey, Revel (FR); Michel Mensler, Montigny le Bretonneux (FR); Christophe Dang-Van-Nhan, Villejuif (FR)

(73) Assignee: Renault S.A.S., Boulogne-billancourt (FR)

( * ) Notice: Subject to any disclaimer, the term of this patent is extended or adjusted under 35 U.S.C. 154(b) by 45 days.

(21) Appl. No.: 15/322,241

(22) PCT Filed: Jun. 25, 2015

(86) PCT No.: PCT/FR2015/051712
§ 371 (c)(1),
(2) Date: Dec. 27, 2016

(87) PCT Pub. No.: WO2015/197982
PCT Pub. Date: Dec. 30, 2015

(65) Prior Publication Data
US 2017/0133728 A1    May 11, 2017

(30) Foreign Application Priority Data

Jun. 26, 2014  (FR) ..................... 14 56009

(51) Int. Cl.
*H01M 10/48* (2006.01)
*G01R 31/36* (2006.01)
(Continued)

(52) U.S. Cl.
CPC ...... *H01M 10/482* (2013.01); *G01R 31/3658* (2013.01); *H01M 2/1077* (2013.01); *H01M 2010/4271* (2013.01); *H01M 2220/20* (2013.01)

(58) Field of Classification Search
CPC ............ G01R 31/3658; H01M 10/482; H01M 2/1077; H01M 2010/4271; H01M 2220/20
See application file for complete search history.

(56) References Cited

U.S. PATENT DOCUMENTS 5,739,669 A * 4/1998 Brulhardt ............ H01M 10/482
320/117
6,411,912 B1  6/2002 Sack
(Continued)

FOREIGN PATENT DOCUMENTS

DE  10 2011 005603   9/2012
WO  WO2010/074290   7/2010

*Primary Examiner* — Anthony R. Jimenez
*Assistant Examiner* — Paul Baillargeon
(74) *Attorney, Agent, or Firm* — Occhiuti & Rohlicek LLP

(57) ABSTRACT

An accumulator battery system includes series-connected accumulators with potentials across stages powering corresponding controllers that measure potential differences between terminals of accumulators. A first analog-to-digital converter encodes the potential measured between terminals of an accumulator. A first output delivers a first digital sequence corresponding to the encoded potential difference, logic levels of which are defined by at least two potentials across the first-stage accumulator terminals. A decoder decodes a potential measured by the first control-device from the first digital sequence. A second analog-to-digital converter selectively encodes a potential difference measured between terminals of a second-stage accumulator of the second stage and two potentials of the digital sequence (Continued)

received on the input. A second control-device processor extrapolates a potential difference across the first-stage accumulator terminal of the first stage based on two potentials of the received digital sequence.

12 Claims, 5 Drawing Sheets

(51) Int. Cl.
*H01M 2/10* (2006.01)
*H01M 10/42* (2006.01)

(56) References Cited

U.S. PATENT DOCUMENTS

| | | |
|---|---|---|
| 9,269,991 B2 * | 2/2016 | Takeshita .......... H01M 10/4207 |
| 2006/0012336 A1 * | 1/2006 | Fujita .................... H02J 7/0021 |
| | | 320/119 |
| 2006/0012337 A1 | 1/2006 | Hidaka et al. |
| 2008/0164882 A1 | 7/2008 | Jaeger et al. |
| 2008/0180106 A1 | 7/2008 | Gorbold |
| 2015/0333541 A1 | 11/2015 | Butzmann |

* cited by examiner

SYSTEM OF ACCUMULATOR BATTERIES WITH MORE RELIABLE VOLTAGE MEASUREMENT

RELATED APPLICATIONS

This application is the US National Stage under 35 USC 371 of international application PCT/FR2015/051712, filed on Jun. 25, 2015, which claims the benefit of the Jun. 26, 2014 priority date of French application FR 1456009.

FIELD OF INVENTION

The invention relates to electrochemical accumulator batteries.

BACKGROUND

Electrochemical accumulator batteries can be used in electrical and hybrid transport systems or embedded systems, for example.

An electrochemical accumulator usually has a nominal voltage of the following orders of magnitude: 1.2 V for NiMH type batteries, 3.3 V for iron-phosphate-based lithium-ion, LiFePO4, technology, and 3.7 V for cobalt-oxide-based lithium-ion type technology.

For most systems to be powered, these nominal voltages are too low. To obtain the proper voltage level, power, and capacity, it is known to arrange several accumulators in stages. The number of stages and the arrangement of accumulators within a stage varies vary according to the desired voltage, current, and capacity for the battery. The association of several accumulators is called an accumulator battery.

The charging of an accumulator results in an increase in the voltage across its terminals. Each accumulator technology has its own distinct charge profile, defined for example by changes in the voltage of an accumulator over time for a given charge current.

An accumulator is charged when, under a given current, it has reached a nominal voltage level defined by its electrochemical process. If charging is interrupted before this voltage is reached, the accumulator is not fully charged. The accumulator is also charged when charging has lasted a predetermined duration, or when the charging current, while the accumulator is maintained at constant voltage, has reached a minimum threshold value.

Because of manufacturing variations, accumulators have different characteristics in practice. Because of heterogeneous wear of the battery's accumulators, these differences, which are relatively small when the battery is new, grow with time. Variations still remain even when accumulators from the same manufacturing batch are associated in a battery.

The operating range of a cobalt-oxide-based Li-ion type accumulator is typically between 2.7 V and 4.2 V. Use outside this range can irreversibly deteriorate the battery's accumulators. A voltage below the operating range deteriorates the cell. Overcharging can lead to the destruction of an accumulator or accelerated wear. In some cases, thermal runaway phenomena can cause the accumulator to explode.

It is therefore useful to have control devices to monitor the voltage level of each stage. Each control device communicates with a central unit to supply it with the measured voltage level for its stage. The central unit generates charge or discharge interruption commands for each stage according to the voltage levels that it receives.

The charging of all the stages is interrupted, for example, when the most charged stage reaches an upper limit of the operating range. The voltage of the least charged stage is thus equal to a voltage below the upper limit.

The central unit also controls the discharge interruption of the battery when the least charged stage reaches a lower limit of the operating range.

As the measurements and the interruption decisions are carried out remotely, communication between the control devices and the central unit is essential to ensure the integrity of the battery.

SUMMARY

The invention aims to solve this drawback. The invention thus relates to an accumulator battery system.

In one aspect, the invention features an accumulator battery system having first and second electrochemical accumulator stages that are connected to each other in series, first and second control-devices, and a potential-level converter. The first control-device includes a first output interface and a first analog-to-digital converter. The second control-device includes an input interface, a second output interface, a decoder, a second analog-to-digital converter, and a processing device. A potential across terminals of at least one accumulator of the first stage provides power to the first control-device. Meanwhile, a potential across terminals of at least one accumulator of the second stage provides power to the second control-device. The first control-device is configured to measure a potential difference between terminals of an accumulator of the first stage. The first analog-to-digital converter is configured to encode the potential difference measured between the terminals of the accumulator of the first stage. The first output interface is configured to deliver a first digital sequence corresponding to the encoded potential difference, logic levels of which are defined by at least two potentials across the accumulator terminals of the first stage. The second control-device is configured to measure the potential difference between the terminals of an accumulator of the second stage. The decoder is configured to decode a potential difference measured by the first control-device from the first digital sequence received on the input interface. The second analog-to-digital converter is configured to selectively encode at least one of a potential difference measured between terminals of the accumulator of the second stage and two potentials of the digital sequence received on the input interface. The processing device of the second control-device is configured to extrapolate a potential difference across the terminals of the accumulator of the first stage based on two potentials of the received digital sequence. The second output interface is configured to deliver a second digital sequence selectively corresponding to at least one of the encoded potential difference, the decoded potential difference, and the information representative of the potential difference extrapolated by the processing device. The potential-level converter is configured to convert two potentials of the first digital sequence applied by the first output interface into two potentials between supply potentials of the second control-device. The potential-level converter is configured to apply the first digital sequence converted to the input interface of the second control-device.

In some embodiments, the potential-level converter includes a voltage divider having first and second electric loads. The first electric load is connected between the first output interface of the first control-device and the input interface of the second control-device. The second electric load is connected between the input interface of the second control-device and one of the supply potentials of the second control-device.

In other embodiments, the second stage has a maximum operating potential difference at its terminals and a minimum operating potential difference at its terminals. In such embodiments, a voltage divider of the potential-level converter includes a first electric load having a first impedance and a second electric load having a second impedance. The first electric load connects between the first output interface of the first control-device and the input interface of the second control-device. The second electric load connects between the input interface of the second control-device and one of the supply potentials of the second control-device. The first impedance, when divided by the second impedance, defines an impedance ratio that exceeds a ratio of the maximum operating potential different to the minimum operating potential difference.

In yet other embodiments, the first digital sequence includes two logic levels. The potentials across the terminals of the first stage define the two logic levels.

Also among the embodiments are those in which, the first stage of accumulators and the second stage of accumulators each comprise electrochemical accumulators connected in series. The first control-device is configured to measure the potential difference between the terminals of each of the accumulators of the first stage. The second control-device is configured to measure the potential difference between the terminals of each of the accumulators of the second stage. At least one of the logic levels of the first digital sequence is defined by a potential at one terminal of one of the accumulators of the first stage.

In yet other embodiments, the first control-device is powered through a voltage step-down converter that receives, at the input, the potential difference between the terminals of the first stage of accumulators, the potential difference having been measured by the first control-device, A potential difference between the terminals of each of the accumulators of the second stage is measured by the second control-device. A potential at one terminal of one of the accumulators of plural accumulators that comprise the first stage defines at least one of the logic levels of the first digital sequence.

Further embodiments include those in which the potential-level converter is free of galvanic isolation.

In still other embodiments, the first and second control-devices are configured to selectively apply a discharge current to the first and second stages respectively. In these embodiments, the first control-device includes a processing device, and the processing devices of the first and second control-devices are configured to selectively control application or interruption of a discharge current on their respective stage based on a digital sequence received on a respective input interface.

Some embodiments include a control circuit connected to an output interface of one of the first control-device and the second control-device, In such embodiments, a galvanic isolation circuit facilitates the connection between the control circuit and the output interface, and the control circuit is configured to decode a digital sequence received from either the first or second control-device and including a potential difference value. Among there are embodiments in which the control circuit connects to an input interface of one of the first and second control-devices using the galvanic isolation circuit, and wherein the control circuit is configured to generate a digital sequence that controls one of application and interruption of a discharge current by the control device on a stage thereof.

Also among the embodiments are those in which a logic level of the first digital sequence delivered on the first output interface of the first control-device is defined by applying a high impedance state at the first output interface.

In alternative embodiments, the decoder of the second control-device is configured to decode the potential difference measured by the first control-device by comparing the first digital sequence received on the input interface to at least one potential threshold. In these embodiments, the second control-device is configured to change the value of the potential threshold according to at least one potential of a digital sequence received on the input interface.

BRIEF DESCRIPTION OF THE DRAWINGS

Other features and advantages of the invention will be apparent from the description that follows, given by way of non-limiting example, with reference to the accompanying drawings, in which.

DETAILED DESCRIPTION

Figures 1, 2:
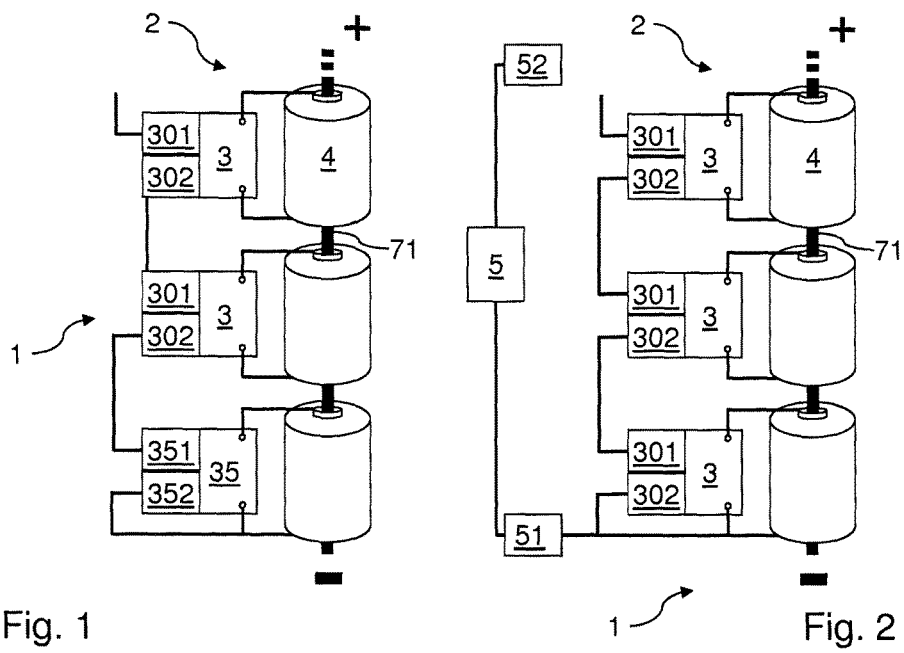
FIG. 1 is a schematic representation of a first example of an accumulator battery system according to the invention.
FIG. 2 is a schematic representation of a second example of an accumulator battery system according to the invention.

FIGS. 1 and 2 show first and second embodiments of an accumulator battery system 1. Such systems can be used to drive, for example, an electric motor.

The accumulator battery system 1 includes a battery 2 having electrochemical accumulator stages 4 (hereafter referred to as "stages") that are connected in series. The battery 2 comprises a large number of stages 4. In some embodiments, as many twenty to a hundred accumulator stages connect in series, depending on the required voltage and the type of accumulators used. Power connections 71 connect the stages 4 in series with each other.

Attached to each stage 4 is a control device 3, 35 having input and output interfaces 301, 302, 351, 352. Each control device 3, 35 measures the potential difference across the terminals of the stage 4 to which it is attached. The control devices 3, 35 are also configured to communicate step-by-step, notably to communicate measured potential difference values to each other.

The embodiment of FIG. 1 has slave control-devices 3 and a master control device 35. Each slave control-device 3 has an input interface 301 and an output interface 302. The master control-device 35 includes an input interface 351 and an output interface 352. Such a structure allows the master control-device 35 to transmit commands to the slave control-devices 3 by dispensing with galvanic isolation between the slave control-devices 3 and the master control-device 35.

Unlike the embodiment shown in FIG. 1, the embodiment of FIG. 2 only has slave control-devices 3. Like those in FIG. 1, each of these slave control-devices 3 has an input interface 301 and an output interface 302. A remote central-unit 5 connects to the ends of a communication daisy chain formed by the slave control-devices 3. It does so via first and second galvanic-isolation devices 51, 52. The remote central-unit 5 typically retrieves values of potential difference as measured by the slave control-devices 3 and provides commands to the slave control-devices 3.

Figures 3, 4:
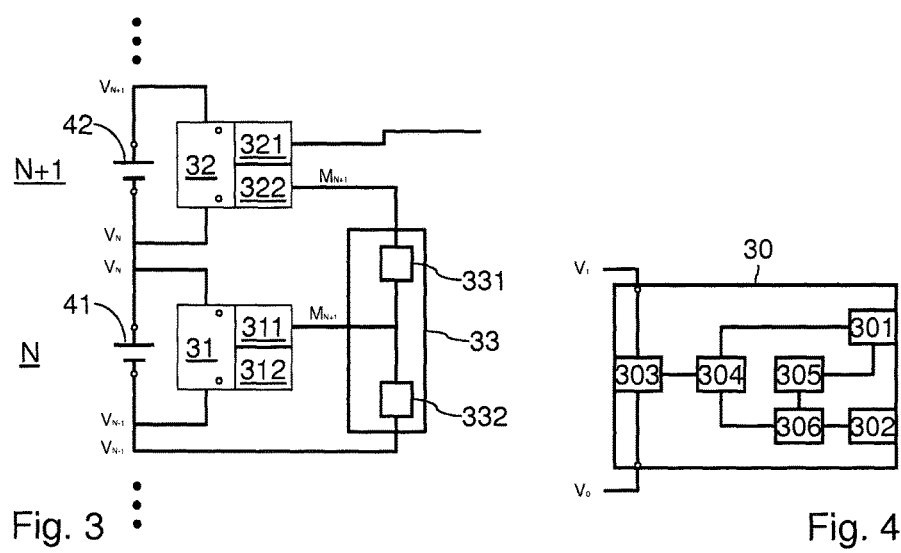
FIG. 3 represents a first example of a control device association.
FIG. 4 schematically represents an example of a control device.

FIG. 3 represents a first example of a control device association at first and second stages 41, 42 connected in series. In the series connection between the negative and positive terminals of the battery 2, the first stage 41 is index N and the second stage 42 is index N+1. The potential at the negative terminal of first stage 41 will be denoted $V_{n-1}$; the potential at the positive terminal of first stage 41 will be denoted $V_n$ and will be equal to the potential at the negative terminal of second stage 42; the potential at the positive terminal of the second stage 42 will be denoted $V_{n+1}$. Assuming that the mean potential difference across the terminals of the stages is equal to $V_{cel}$ (it is assumed that the nominal voltage of each stage is identical), the potential $V_{n-1}$ is approximately equal to $(N-1)*V_{cel}$.

A first control-device 31 is attached and electrically connected to the first stage 41. The first control-device 31 is powered by the potentials $V_n$ and $V_{n-1}$. A second control-device 32 is attached and electrically connected to the second stage 42. The second control-device 32 is powered by the potentials $V_{n+1}$ and $V_n$.

In the example shown in FIG. 3, communication takes place from the second control-device 32 to the first control-device 31. The first control-device 31 has an input interface 311 and an output interface 312. The second control-device 32 has an input interface 321 and an output interface 322. The output interface 322 connects to the input interface 311 via a potential-level converter 33. The input interface 321 connects to the output interface of the control device of the stage of index N+2. The output interface 312 connects to the input interface of the control device of the stage of index N−1.

The second control-device 32 measures the potential difference across the terminals of the second stage 42 and digitizes this potential difference. In some embodiments, it does so with single-bit encoding by comparison to a threshold.

The second control-device 32 then applies the digitized potential difference (denoted $M_{n+1}$) to the output interface 322. This digitized potential difference is typically in the form of a digital sequence that has at least two logic levels equal to $V_{n+1}$ and $V_n$, respectively. Such a digital sequence can be formed, for example, by using a switch to apply either the potential $V_{n+1}$ or $V_n$ at the output.

The second control-device 32 applies this digital sequence to an input of the potential-level converter 33. An output of the potential-level converter 33 connects to the first control-device's input interface 311. A reference terminal of the potential-level converter 33 connects to the potential $V_{n-1}$.

The potential-level converter 33 converts the logic levels of the digital sequence applied to its input into logic levels between the supply potentials of the first control-device 31. The digital sequence at the input of the potential-level converter 33 has two logic levels equal to $V_{n+1}$ and $V_n$, respectively, the potential-level converter 33 applying a digital sequence to the first control-device's input interface 311 with two logic levels between $V_n$ and $V_{n-1}$.

Between its reference terminal and its input, the potential-level converter 33 forms a voltage divider. In the illustrated embodiment, the potential-level converter 33 has a resistor 331 and a resistor 332. The resistor 331 connects between the second control device's output interface 322 and the first control device's input interface 311. The resistor 332 connects between the first control device's input interface 311 and the reference terminal of this potential-level converter 33.

In the particular case in which the first and second resistors 331, 332 have the same resistance, the two logic levels of the digital sequence applied to the input interface 311 are equal to $(V_{n-1}+(V_{n+1}-V_{n-1})/2)$ and $(V_{n-1}+(V_n-V_{n-1})/2)$, respectively. Other voltage division ratios may be used. For example, in some embodiments, the resistor 331 has a resistance value that is twice that of the resistor 332.

The first control-device 31 measures the potential difference across the terminals of the first stage 41 and digitizes this potential difference (denoted $M_n$). In some embodiments, this digitizing process includes single-bit encoding by comparison to a threshold.

The first control-device 31 then decodes the digital sequence received at its input interface 311 in order to read the potential difference $M_{n+1}$ of the second stage 42. In addition, the first control-device 31 measures the logic levels of the digital sequence received at its input interface 311.

Based on the logic levels measured on the digital sequence received at its input interface 311, the first control-device 31 extrapolates the potential difference across the terminals of the second stage 42. It does so based on knowledge of the conversion law of the potential-level converter 33. This extrapolated potential difference is denoted $E_{n+1}$. If the first control-device 31 measures two logic levels $NL1_{n+1}$ and $NL2_{n+1}$, and if the potential-level converter 33 forms a voltage divider with identical first and second resistors 331, 332, the following relationship yields the extrapolated potential difference $E_{n+1}$:

$$E_{n+1}=|NL1_{n+1}-NL2_{n+1}|*2$$

The extrapolation of the potential difference $E_{n+1}$ thus ensures a measurement redundancy of the potential across the terminals of the second stage 42. This redundancy can be used either to transmit the values $M_{n+1}$ and $E_{n+1}$ in a daisy-chained manner, or to transmit the value $M_{n+1}$ with a reliability indicator (either a binary value, or a deviation value) to a remote central unit 5 or to a master control device 35.

The first control-device 31 selectively applies either the digitized potential difference $M_n$, the decoded potential difference $M_{n+1}$, the extrapolated potential difference $E_{n+1}$, or a reliability indicator of the measured potential difference $M_{n+1}$ to the output interface 312.

FIG. 4 shows a control device 30 that can be used as a first or second control-device 31, 32. Such a control device 30 is typically implemented using a microcontroller.

The control device 30 includes a measuring circuit 303 that measures the difference between the potentials $V_1$ and $V_0$ applied across the terminals of a stage 4. The control device 30 also has an analog-to-digital converter 304. The measuring circuit 303 applies the measured potential difference to an input of the analog-to-digital converter 304. The analog-to-digital converter 304 then applies the measured potential difference to an input of a processing unit 306. These potentials $V_1$ and $V_0$ power the control device 30.

The control device 30 also has an input interface 301 and an output interface 302. The input interface 301 receives a digital sequence that includes a potential measurement. In some embodiments, an adjacent control device measures this potential. In other embodiments, this potential originates from another control device and passes through an adjacent control device.

The control device 30 also has a decoder 305. The input interface 301 receives the digital sequence and applies it to an input of the decoder 305. The decoder 305 decodes the digital sequence and applies the potential difference measurement to the processing unit 306.

Furthermore, the input interface 301 applies the potentials of the logic levels of the received digital sequence to the input of the analog-to-digital converter 304. The analog-to-digital converter 304 supplies the digital values of these logic levels.

The processing unit 306 extrapolates the potential difference across the stage that issued the digital sequence. It does so based on a difference between these logic levels, as previously described in reference to the first control-device 31. The processing unit 306 can also determine the reliability of the decoded potential difference measurement by comparing it to the extrapolated potential difference, by checking that the deviation between these values is below a threshold, or by simply calculating the deviation between these values.

The processing unit 306 controls the information that must be transmitted via the output interface 302. Such information can include, for example, the potential difference measured by the measuring circuit 303 and digitized by the analog-to-digital converter 304, the potential difference extrapolated by the processing unit 306 based on the logic levels applied to the input interface 301, the potential difference decoded by the decoder 305, a reliability indicator of the decoded potential difference, or a deviation value between the decoded potential difference and the extrapolated potential difference.

The output interface 302 transmits the selected information in the form of a digital sequence that includes at least two logic levels. The voltages associated with these logic levels are equal to $V_n$ and $V_{n-1}$, respectively, i.e. the control device's supply potentials.

A system 1 based on such control devices 30 allows step-by-step communication of a measured potential difference level, with verification of the measured potential difference level by another control device, and without the problems associated with galvanic isolation between different control devices.

Figure 5:
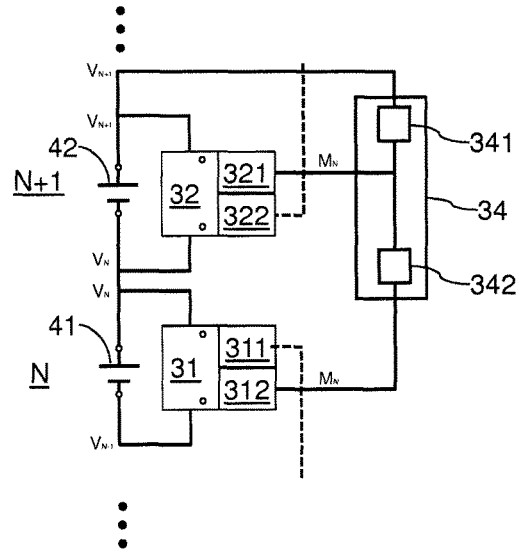
FIG. 5 represents a second example of a control device association.

FIG. 5 represents a second example of an association of control devices at first and second stages 41, 42 connected in series and identified by the indices N and N+1, respectively. The potentials are identified with the same references as in FIG. 3. A first control-device 31 is attached and electrically connected to the first stage 41. The first control-device 31 is powered by the potentials $V_n$ and $V_{n-1}$. A second control-device 32 is attached and electrically connected to the second stage 42. The second control device 32 is powered by the potentials $V_{n+1}$ and $V_n$.

In the example shown in FIG. 5, communication takes place from the first control-device 31 to the second control device 32.

In FIG. 5, the first control-device 31 has an input interface 311 and an output interface 312; and the second control-device 32 has an input interface 321 and an output interface 322. The first control device's output interface 312 connects to the second control device's input interface 321 via a potential-level converter 34. The first control device's input interface 311 connects to an output interface of a control device of an adjacent $(N-1)^{th}$ stage. The second control device's output interface 322 connects to an input interface of the control device of an adjacent $(N+2)^{th}$ stage.

The first control-device 31 measures the potential difference across the terminals of the first stage 41, digitizes this potential difference (optionally with single-bit encoding by comparison to a threshold) and applies the digitized potential difference (denoted $M_n$) to the output interface 312 in the form of a digital sequence including at least two logic levels equal to $V_n$ and $V_{n-1}$, respectively, for example by means of a switch applying either the potential $V_{n+1}$ and $V_n$ at the output. The digital sequence is applied to an input of the potential-level converter 34. An output of the converter 34 connects to the input interface 321. A reference terminal of the converter 34 connects to the potential $V_{n+1}$. The converter 34 converts the logic levels of the digital sequence applied to its input into logic levels between the supply potentials of the second control-device 32. The digital sequence on the input of the converter 34 has two logic levels equal to $V_n$ and $V_{n-1}$, respectively, the converter 34 applying a digital sequence to the input interface 321 with two logic levels between $V_n$ and $V_{n+1}$.

The converter 34 forms a voltage divider between its reference terminal and its input. The converter 34 has, for example, a resistor 341 connected between the reference terminal of this converter 34 and the input interface 321, and a resistor 342 connected between the input interface 321 and the output interface 312. For example, if the third and fourth resistors 341, 342 have the same resistance, the digital sequence applied to the input interface 321 has two logic levels equal to $(V_{n+1}-(V_{n+1}-V_{n-1})/2)$ and $(V_{n-1}-(V_{n+1}-V_n)/2)$, respectively. Of course, other voltage division ratios may be used, for example with a resistor 342 having a resistance value that is twice that of the resistor 341.

The second control-device 32 measures the potential difference across the terminals of the second stage 42 and digitizes this potential difference (denoted $M_{n+1}$). One way to carry out such digitization is to carry out single-bit encoding by comparison to a threshold.

Furthermore, the second control-device 32 decodes the digital sequence received at the input interface 321 in order to read the potential difference $M_n$ of the first stage 41. In addition, the second control-device 32 measures the logic levels of the digital sequence received at the input interface 321. Based on the logic levels measured on the digital sequence received at the input interface 321, the second control-device 32 extrapolates the potential difference across the terminals of the first stage 41, notably based on knowledge of the conversion law of the converter 34. The extrapolated potential difference is denoted $E_n$. If the second control-device 32 measures two logic levels $NL1_n$ and $NL2_n$, if the converter 34 forms a voltage divider with identical third and fourth resistors 341, 342, $E_n$ is obtained by the following relationship:

$$E_n = |NL1_n - NL2_n| * 2$$

The extrapolation of the potential difference $E_n$ thus ensures measurement redundancy of the potential across the terminals of the first stage 41. This redundancy can be used either to transmit the values $M_n$ and $E_n$, in a daisy-chained manner, or to transmit the value $M_n$ with a reliability indicator (either a binary value, or a deviation value) to a central unit or to a master control device.

The second control-device 32 selectively applies either the digitized potential difference $M_{n+1}$, the decoded potential difference $M_n$, the extrapolated potential difference $E_n$, or a reliability indicator of the measured potential difference $M_n$ to the output interface 322.

The first and second control-devices 31, 32 of FIG. 5 may have the structure of the control device 30 detailed in reference to FIG. 4.

The control devices used can also implement both upward communication between control devices, and downward communication between control devices. For this purpose, each control device may include two input interfaces (a first interface intended to communicate with an output interface of the control device of superior index, a second interface intended to communicate with an output interface of the control device of inferior index) and two output interfaces (a first interface intended to communicate with an input interface of the control device of superior index, a second interface intended to communicate with an input interface of the control device of inferior index).

To avoid distortion between the supply potentials of a control device 30 and the logic levels of the digital sequence that it transmits, the first and second resistors 331, 332 and the third and fourth resistors 341, 342 advantageously have relatively high resistance values, for example between 10 kΩ and 1 MΩ, in order to limit the current passing through them. The potential difference extrapolated from the logic levels thus remains fairly precise. A relatively high value enhances the precision of the extrapolated potential difference, a relatively low value enhances thermal noise immunity and limits the need to include an input filter.

For a control device arranged at the end of the series connection, referred to below as an "end control-device," it is possible to provide redundancy to a measurement of the potential difference at that end control-device's stage. In an optional feature of the disclosed apparatus, an additional control device provides such redundancy.

Figure 6:
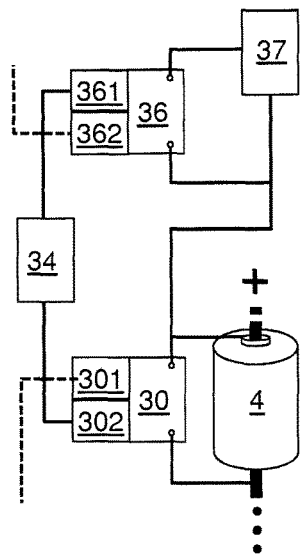
FIG. 6 represents an additional control device associated with a control device of one end of the battery.

FIG. 6 shows an example of a configuration that uses such redundancy.

According to FIG. 6, an end control-device 30 connects to the terminals of a stage 4 that also connects to the battery's positive terminal. In FIG. 6, an additional control-device 36 connects in such a way that the potential at the battery's positive terminal acts as a reference. A DC/DC converter 37 powers this additional control device 36 and also applies another supply potential to the additional control device 36. An input interface 361 of the additional control device 36 connects to the output interface 302 of the end control-device 30 via a converter 34 as detailed previously. Such a configuration allows the same structure to be used for the additional control-device 36 and the end control-device 30.

The decoder 305 of a control device 30 typically discriminates between two logic levels in the digital sequences that it receives. It does so by comparing the potential levels that it receives with a threshold. If a received signal has a level above this threshold, the decoder 305 assigns it a first digital value, for example "1." If a received signal has a value below this threshold, the decoder 305 assigns it a second digital value, for example "0." To limit the risk of a decoding error, it is advantageous to set the threshold to be the median value between the expected potentials on the input interface.

Because a control device 30 is powered by the stage to which it connects, the supply potentials of the control device 30 vary according to the charge, aging, or internal resistance of this stage, or according to the current delivered by this stage. Consequently, the potential levels of the digital signal that it generates and provides to another control device 30 vary.

To circumvent this difficulty, each control device 30 adapts the threshold of its decoder 305. The threshold can be adapted during an initialization step. During an initialization step, a control device 30 receives a digital sequence from another control device 30 and sets its threshold to be the median value between the potential levels of the digital sequence that it receives. In some embodiments, instead of the median, the control device 30 uses the average between these potential levels on a certain number of samples.

To promote immunity from interference, some embodiments compare the received signal to an upper threshold and to a lower threshold. These embodiments attribute the first digital value to the received signal only if it exceeds the upper threshold. Conversely, these embodiments attribute the second digital value to the received only if it is below the lower threshold. Among these embodiments are those that adapt the values of the upper and lower thresholds according to potentials of a received digital sequence. In some embodiments, such a digital sequence is received during initialization.

Figure 7:
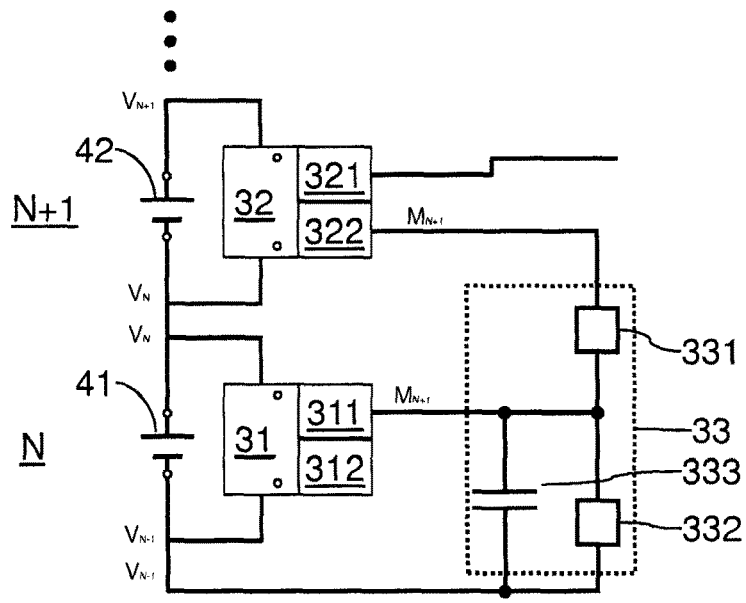
FIG. 7 represents a variant of the example of a control device association of FIG. 3.

FIG. 7 illustrates a variant of the association of the control devices of FIG. 3. In this example, the potential-level converter 33 includes a filter that limits the bandwidth to the frequencies used for communication between the control devices. In the illustrated embodiment, the filter is an RC filter having a capacitor 333 connected in parallel with the resistor 332.

Figure 8:
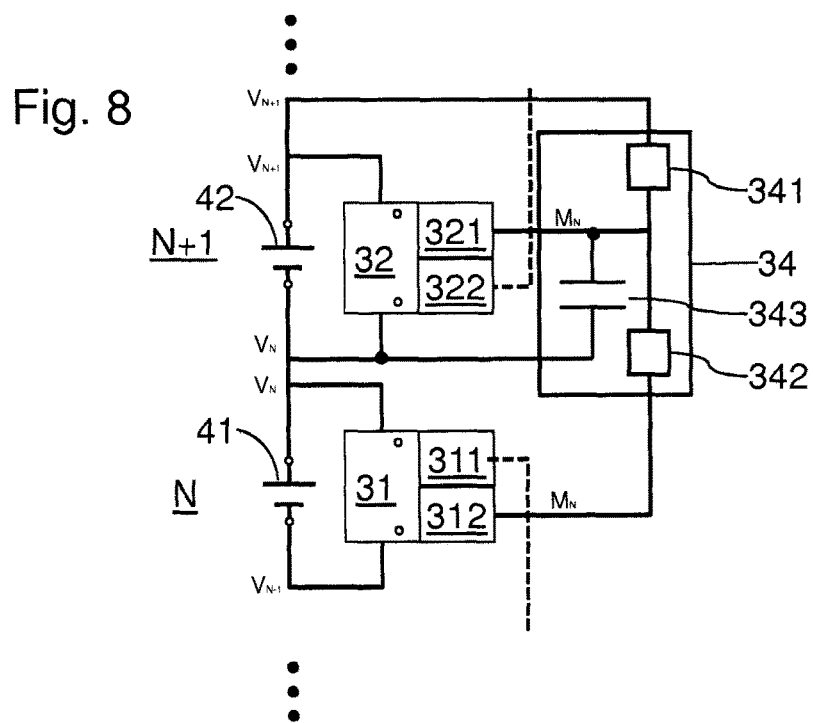
FIG. 8 represents a variant of the example of a control device association of FIG. 5.

FIG. 8 illustrates a variant of the association of the control devices of FIG. 5. In this example, the converter 34 includes a filter that limits the bandwidth to the frequencies used for communication between the control devices. In the illustrated embodiment, the filter is an RC filter having a capacitor 343 connected between the input interface 321 and the potential $V_n$.

For a potential-level converter 33 as detailed previously, it is possible to set rules limiting uncertainty on the logic levels of the digital sequences. In this context, it is useful to define a ratio a as a=R331/R332, where R311 is the resistance of the resistor 331 and R332 is the resistance of the resistor 332.

For example, in order for the potentials of the digital signal transmitted by the first control-device 31 to the second control-device 32 of FIG. 3 to be between the supply potentials of the second control-device 32, the following relationship must be satisfied:

$$0 \le (V_{n+1} - V_{n-1})/(1+a) \le (V_n - V_{n-1})$$

The foregoing relationship can be satisfied if the ratio between the maximum potential difference of a charged stage and the minimum potential difference of a discharged stage=remains less than a.

Once the ratio a is set, the orders of magnitude of the resistances R331 and R332 remain to be set. These values can be set according to the input impedance of the analog-to-digital converters 304, and/or according to a desired bandwidth for the potential-level converter 33.

For a potential converter 34 as detailed previously, rules can also be set limiting the uncertainty on the logic levels of the digital sequences. If the resistance of the resistor 341 is R341 and the resistance of the resistor 342 is R342, it is useful to define the ratio b as b=R342/R341.

For example, in order for the potentials of the digital signal transmitted by the second control-device 32 to the first control-device 31 of FIG. 5 to be between the supply potentials of the first control-device 31, the following relationships must be satisfied:

$$0 \le (V_{n+1}-V_n)*R342/(R341-R342)-(V_n-V_{n-1})*R341/(R341+R342)$$

and $$(V_{n+1}-V_n)*R342/(R341+R342)-(V_n-V_{n-1})*R341/(R341+R342) \le (V_{n+1}-V_n)$$

These relationships can be satisfied if the ratio between the maximum potential difference of a charged stage and the minimum potential difference of a discharged stage on the other hand, remains less than b.

Once the ratio a or b is established, the orders of magnitude of resistances R341 and R342 remain to be set. These values can, for example, be set according to the input impedance of the analog-to-digital converters 304, and/or according to a desired bandwidth for the converter 34.

Each control device can implement commands received from a remote central unit 5 or from a master control device 35 in order to apply a discharge current across, for example, the terminals of its stage 4. Such a discharge current may, for example, be implemented in order to perform charge balancing of the stages 4.

Figure 9:
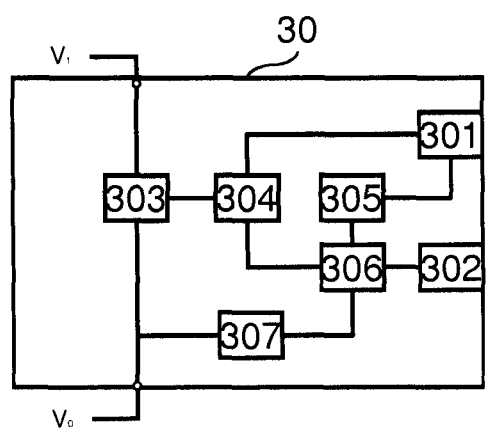
FIGS. 9 and 10 represent variants of a control device intended to charge a stage.

FIG. 9 illustrates a first variant of a control device 30 configured to perform a balancing discharge of its stage. The control device 30 comprises a resistor 307 selectively powered according to a command from the processing unit 306. In this case, the resistor 307 connects to the potential $V_0$ in order to perform the discharge of the stage connected to the control device 30.

Figure 10:
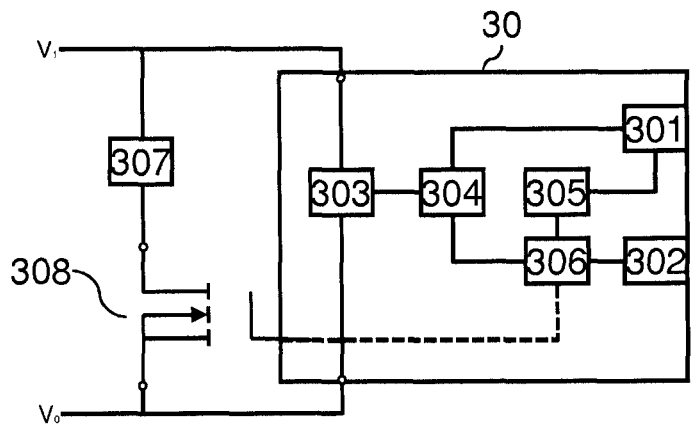

FIG. 10 illustrates a second variant of a control device 30. The control device 30 comprises a microcontroller, a transistor 308 controlled by a processing unit 306 of the microcontroller, and a resistor 307 connected in series with the transistor 308 between the potentials $V_0$ and $V_1$. In this embodiment, the transistor 308 is an nMOS transistor controlled in two-state mode. Such a control device 30 allows a relatively high discharge current to be applied.

In an alternative embodiment, the control devices 30 are configured to apply their supply potentials for first and second logic levels, and a high-independence state for a third logic level. In the example of FIG. 3, when the output interface 322 is in the high-impedance state, the potential $V_{n-1}$ is applied to the input interface 311. The potential applied to the input interface 311 is then independent of the potential differences of the first and second stages 41, 42. The first and second supply potentials of the control device 30 can, for example, encode a "1," and the high-impedance state can encode a "0." The first and second supply potentials can be used by another control device in order to extrapolate the potential difference and compare it to the potential difference encoded in the digital sequence.

In the example of FIG. 4, when the output interface 312 is in the high-impedance state, the potential $V_{n+1}$ is applied to the input interface 321. The potential applied to the input interface 321 is thus stable and allows the full range of the analog/digital converter of the control device 30 to be used. The first and second supply potentials of the control device 30 can, for example, encode a "0," and the high-impedance state can encode a "1." The first and second supply potentials can be used by another control device in order to extrapolate the potential difference and compare it to the potential difference encoded in the digital sequence.

The communication and redundancy information can thus be de-correlated.

Figure 11:
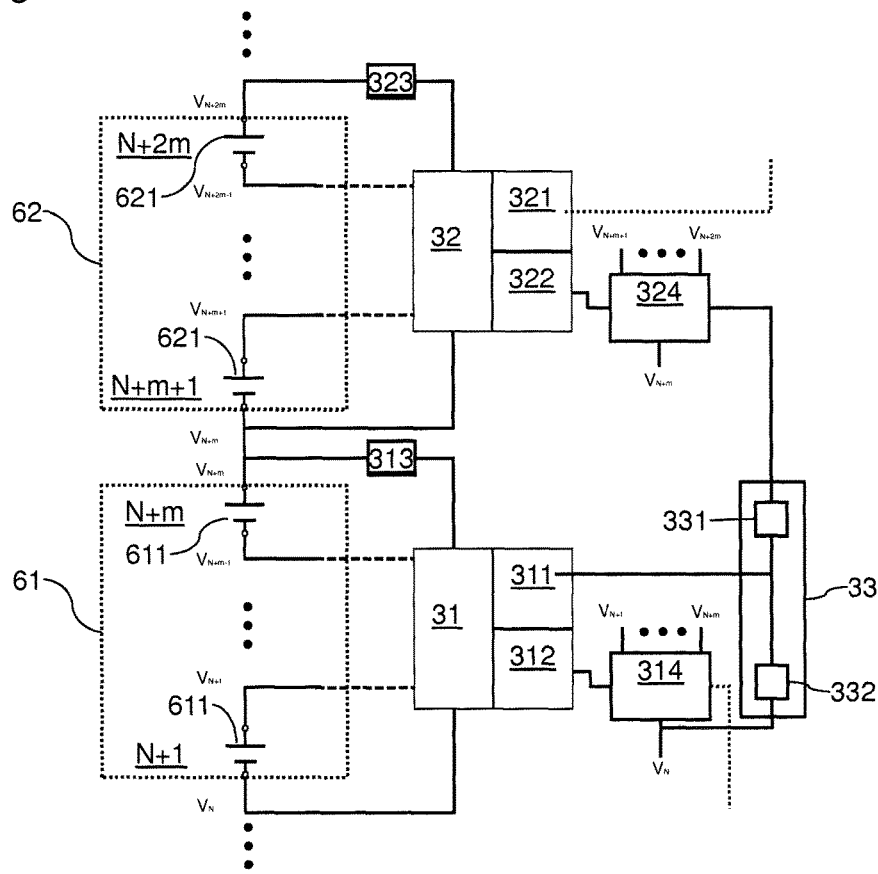
FIG. 11 is a schematic representation of a third example of an accumulator battery system according to the invention.

FIG. 11 is a schematic representation of another example of an accumulator battery system. This example corresponds to a downward communication, although it may be implemented as upward communication in a similar manner. To reduce the cost of the system 1, each control device is shared for the same module comprising several stages in series, while maintaining the ability to measure the potential difference across the terminals of each stage. This is important for safety.

The illustrated system 1 includes first and second modules 61, 62 connected in series. The first and second modules 61, 62 are also connected in series with other modules not illustrated. The first module 61 comprises a plurality of accumulators 611 connected in series. The second module 62 comprises a plurality of accumulators 621 connected in series. Each stage of the first and second modules 61, 62 comprises a single accumulator. However, in other embodiments, each stage includes a plurality of accumulators connected in parallel. For the sake of simplification, the first and second modules 61, 62 comprise the same number m of accumulators connected in series.

A first control-device 31 is attached and electrically connected to the first module 61. The various potentials $V_N$ to $V_{N+m}$ are applied to a measurement input of the first control-device 31. The various potentials $V_{N+1}$ to $V_{N+m}$ are also applied to an input of an analog level multiplexer 314. The potential $V_N$ is also applied to a reference terminal of the multiplexer 314.

A second control-device 32 is attached and electrically connected to the second module 62. The various potentials $V_{N+m}$ to $V_{N+2m}$ are applied to a measurement input of the second control-device 32. The various potentials $V_{N+m+1}$ to $V_{N+2m}$ are also applied to an input of an analog level multiplexer 324. The potential $V_{N+m}$ is also applied to a reference terminal of the multiplexer 324. According to a signal applied to a control terminal, the analog multiplexers selectively apply, to their output, one of the potentials received on an input or on the reference terminal.

In order to have a stable supply voltage, with a level compatible with a voltage control device, and with an identical consumption for the various accumulators in series in a module, the control devices are advantageously powered by voltage regulation circuits connected to the terminals of the entire module. In the example, the first control-device 31 is provided with a first voltage-regulating circuit 313 and the second control-device 32 is provided with a second voltage-regulating circuit 323. In the illustrated embodiment, the first and second voltage-regulating circuits 313, 323 are step-down voltage converters, their inputs being powered by the voltage difference across the terminals of their respective modules. If the potential difference, which is assumed to be substantially identical for all stages, is defined as $V_m$, the first and second voltage regulating-circuits 313, 323 advantageously power their respective control devices with this potential difference $V_m$.

In the example shown in FIG. 11, the communication takes place from the second control-device 32 to the first control-device 31. The first control-device 31 has an input interface 311 and an output interface 312. The output interface 312 connects to a control input of the multiplexer 314. The second control-device 32 has an input interface 321 and an output interface 322. The output interface 322 connects to the control terminal of the multiplexer 324. The output of the multiplexer 324 connects to the input interface 311 via a potential-level converter 33.

The potential-level converter 33 forms a voltage divider between its reference terminal and its input, as described in a previous example. The potential-level converter 33 has a resistor 331 connected between the multiplexer 324 and the input interface 311, and a resistor 332 connected between the input interface 311 and the reference potential $V_N$ of the first control-device 31.

The second control-device 32 measures the potential of the upper terminal of an accumulator of index k (with k between 1 and m) or the potential difference across the terminals of this accumulator of the module 62. The measurement is digitized and a digital sequence is applied to the output interface 322 in order to select an input of the multiplexer 324 that will provide a high logic-level or the reference terminal that will provide a low logic-level. The multiplexer 324 has m+1 different input potentials.

Advantageously, certain potentials (e.g. the potentials $V_{N+m}$ to $V_{N+m/2}$) are used to encode a low logic-level, and other potentials (e.g. potentials $V_{N+m/2+1}$ to $V_{N+2m}$) are used to encode a high logic-level. A digital threshold Sn is set to a value between $V_{N+m/2}$ and $V_{N+2m+1}$. The digital sequence generated via the multiplexer 324 may use different potentials for a high state. Similarly, the digital sequence generated via the multiplexer 314 may use different potentials for a high state. The first control-device 31 may thus redundantly have potentials at each terminal of the accumulators 621.

Figure 12:
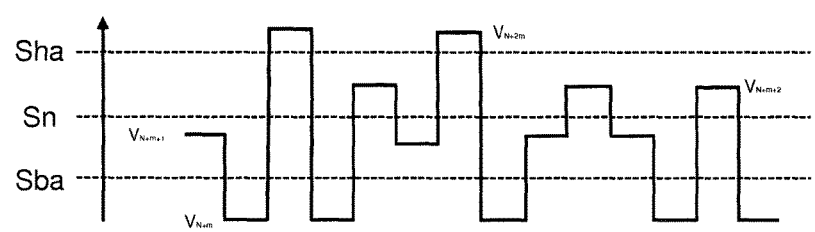
FIG. 12 is a diagram illustrating various thresholds implemented based on the signals received.

FIG. 12 is a diagram illustrating an example of a potential applied to the output of multiplexer 324 during the generation of a digital sequence in a simplified case with 3 accumulators in series in the module 62. The potentials $V_{N+m}$ and $V_{N+m+1}$ encode a "0," while the potentials $V_{N+m+2}$ and $V_{N+2m}$ encode a "1." A low analog threshold Sba allows the potentials encoding a "0" to be identified, a high analog threshold Sha allowing the potentials encoding a "1" to be identified. With appropriate analog thresholds, the first control-device 31 can identify the accumulator 621 whose potential has been used in a given bit of the digital sequence.

The various thresholds may be adapted over time according to the evolution in the potentials received by the first control-device 31.

The transmission by a multiplexer 324 may also be carried out via two outputs applied to respective converters. To transmit a first logic level, a first output of the multiplexer 324 may, for example, apply the potential $V_{N+m+k}$ and a second output may apply the potential $V_{N+m+k-1}$. To transmit a second logic level, the first and second outputs of the multiplexer 324 may apply the potential $V_{N+m}$.

The invention claimed is:

1. An apparatus comprising an accumulator battery system, wherein said accumulator battery system comprises first and second stages, first and second control-devices, and a potential-level converter, wherein said first control-device comprises a first output interface and a first analog-to-digital converter, wherein said second control-device comprises an input interface, a second output interface, a decoder, a second analog-to-digital converter, and a processing device, wherein said first and second stages are electrochemical accumulator stages that are connected to each other in series, wherein a potential across terminals of at least one accumulator of said first stage provides power to said first control-device, wherein a potential across terminals of at least one accumulator of said second stage provides power to said second control-device, wherein said first control-device is configured to measure a potential difference between terminals of an accumulator of said first stage, wherein said first analog-to-digital converter is configured to encode said potential difference measured between terminals of said accumulator of said first stage, wherein said first output interface is configured to deliver a first digital sequence corresponding to said encoded potential difference, logic levels of which are defined by at least two potentials across said accumulator terminals of said first stage, wherein said second control-device is configured to measure said potential difference between said terminals of an accumulator of said second stage, wherein said decoder is configured to decode a potential difference measured by said first control-device from said first digital sequence received on said input interface, wherein said second analog-to-digital converter is configured to selectively encode at least one of a potential difference measured between terminals of said accumulator of said second stage and two potentials of said digital sequence received on said input interface, wherein said processing device of said second control-device is configured to extrapolate a potential difference across said terminals of said accumulator of said first stage based on two potentials of said received digital sequence, wherein said second output interface is configured to deliver a second digital sequence selectively corresponding to at least one of said encoded potential difference, said decoded potential difference, and said information representative of said potential difference extrapolated by said processing device, wherein said potential-level converter is configured to convert two potentials of said first digital sequence applied by said first output interface into two potentials between supply potentials of said second control-device, and wherein said potential-level converter is configured to apply said first digital sequence converted to said input interface of said second control-device.

2. The apparatus of claim 1, wherein said potential-level converter comprises a voltage divider, wherein said voltage divider comprises a first electric load and a second electric load, wherein said first electric load is connected between said first output interface of said first control-device and said input interface of said second control-device, and wherein said second electric load is connected between said input interface of said second control-device and one of said supply potentials of said second control-device.

3. The apparatus of claim 1, wherein said second stage has a maximum operating potential difference at its terminals and a minimum operating potential difference at its terminals, wherein a voltage divider of said potential-level converter comprises a first electric load having a first impedance, said first electric load being connected between said first output interface of said first control-device and said input interface of said second control-device, and a second electric load having a second impedance, said second electric load being connected between said input interface of said second control-device and one of said supply potentials of said second control-device, said first impedance, when divided by said second impedance, defining an impedance ratio that exceeds a ratio of said maximum operating potential different to said minimum operating potential difference.

4. The apparatus of claim 1, wherein said first digital sequence comprises two logic levels, and wherein potentials across said terminals of said first stage define said two logic levels.

5. The apparatus of claim 1, wherein said first stage of accumulators and said second stage of accumulators each comprise electrochemical accumulators connected in series, wherein said first control-device is configured to measure said potential difference between said terminals of each of said accumulators of said first stage, wherein said second control-device is configured to measure said potential difference between said terminals of each of said accumulators of said second stage, wherein at least one of said logic levels of said first digital sequence is defined by a potential at one terminal of one of said accumulators of said first stage.

6. The accumulator battery system as claimed in claim 1, wherein said first control-device is powered through a voltage step-down converter that receives, at said input, said potential difference between said terminals of said first stage of accumulators, said potential difference having been measured by said first control-device, wherein a potential difference between said terminals of each of said accumulators of said second stage is measured by said second control-device, wherein a potential at one terminal of one of said accumulators of plural accumulators that comprise said first stage defines at least one of said logic levels of said first digital sequence.

7. The apparatus of claim 1, wherein said potential-level converter is free of galvanic isolation.

8. The apparatus of claim 1, wherein said first and second control-devices are configured to selectively apply a discharge current to said first and second stages respectively, wherein said first control-device comprises a processing device, wherein said processing devices of said first and second control-devices are configured to selectively control application or interruption of a discharge current on their respective stage based on a digital sequence received on a respective input interface.

9. The apparatus of claim 8, further comprising a control circuit connected to an output interface of one of said first control-device and said second control-device, wherein a galvanic isolation circuit facilitates said connection between said control circuit and said output interface, wherein said control circuit is configured to decode a digital sequence received from one of said first and second control-device and including a potential difference value.

10. The apparatus of claim 9, wherein said control circuit connects to an input interface of one of said first and second control-devices using said galvanic isolation circuit, and wherein said control circuit is configured to generate a digital sequence that controls one of application and interruption of a discharge current by said control device on a stage thereof.

11. The apparatus of claim 1, wherein a logic level of said first digital sequence delivered on said first output interface of said first control-device is defined by applying a high impedance state at said first output interface.

12. The apparatus of claim 1, wherein said decoder of said second control-device is configured to decode said potential difference measured by said first control-device by comparing said first digital sequence received on said input interface to at least one potential threshold, said second control-device being configured to change said value of said potential threshold according to at least one potential of a digital sequence received on said input interface.

* * * * *